United States Patent [19]

Mucke et al.

[11] Patent Number: 5,548,616
[45] Date of Patent: Aug. 20, 1996

[54] SPREAD SPECTRUM RADIOTELEPHONE HAVING ADAPTIVE TRANSMITTER GAIN CONTROL

[75] Inventors: Lars H. Mucke, San Diego, Calif.; Jarmo Heinonen, Salo, Finland

[73] Assignee: Nokia Mobile Phones Ltd., Salo, Finland

[21] Appl. No.: 303,619

[22] Filed: Sep. 9, 1994

[51] Int. Cl.[6] .................................................. H04L 27/04
[52] U.S. Cl. .......................... 375/295; 375/205; 375/297; 375/302; 375/345; 455/89; 455/127; 455/234.1; 330/129
[58] Field of Search .................................. 375/205, 219, 375/296, 297, 340, 345, 302; 455/69, 67.1, 73, 84, 88, 89, 115, 126, 127, 232.1, 234.1, 234.2, 240.1, 246.1; 330/129, 136, 103

[56] References Cited

U.S. PATENT DOCUMENTS

| | | | |
|---|---|---|---|
| 4,225,976 | 9/1980 | Osborne et al. | 455/226 |
| 4,387,465 | 7/1983 | Becker | 375/1 |
| 4,613,990 | 9/1986 | Halpern | 455/33 |
| 4,899,364 | 2/1990 | Akazawa et al. | 375/1 |
| 4,901,307 | 2/1990 | Gilhousen et al. | 370/18 |
| 4,924,191 | 5/1990 | Erb et al. | 330/130 |
| 4,972,430 | 11/1990 | Cantwell | 375/1 |
| 4,993,044 | 2/1991 | Akazawa | 375/1 |
| 5,056,109 | 10/1991 | Gilhousen et al. | 375/1 |
| 5,093,840 | 3/1992 | Schilling | 375/1 |
| 5,099,204 | 3/1992 | Wheatley, III | 330/279 |
| 5,107,225 | 4/1992 | Wheatley, III et al. | 330/279 |
| 5,129,098 | 7/1992 | McGirr et al. | 455/69 |
| 5,132,985 | 7/1992 | Hashimoto et al. | 375/80 |
| 5,134,631 | 7/1992 | Kingston et al. | 375/1 |
| 5,168,505 | 12/1992 | Akazawa et al. | 375/1 |
| 5,204,970 | 4/1993 | Stengel et al. | 455/69 |
| 5,222,104 | 6/1993 | Medendorp | 375/297 |
| 5,265,119 | 11/1993 | Gilhousen et al. | 375/1 |
| 5,267,262 | 11/1993 | Wheatley, III | 375/1 |
| 5,301,236 | 4/1994 | Iizuka et al. | 381/17 |
| 5,452,473 | 9/1995 | Weiland et al. | 455/88 |

FOREIGN PATENT DOCUMENTS

| | | |
|---|---|---|
| 0390360A3 | 10/1990 | European Pat. Off. . |
| 54-104760 | 8/1979 | Japan . |
| WO92/21196 | 11/1992 | WIPO . |
| WO93/05585 | 3/1993 | WIPO . |
| WO93/07702 | 4/1993 | WIPO . |
| WO93/10609 | 5/1993 | WIPO . |

Primary Examiner—Stephen Chin
Assistant Examiner—Amanda T. Le
Attorney, Agent, or Firm—Perman & Green

[57] ABSTRACT

This invention teaches a method, and circuits that operate in accordance with the method, for adaptively controlling the transmitted power of a CDMA transmitter (50, 102). The method includes the steps of: (a) presetting a register, such as a counter (112), with an estimate of a maximum transmitter gain signal, the counter having an count output that is a representation of a maximum transmitter gain signal (TX max); (b) deriving a transmitter gain signal (TX gain) from a received CDMA signal; (c) comparing TX max to TX gain and, if TX gain is greater than TX max, (d) applying a gain control signal to the transmitter that is derived from TX max, and (e) enabling the counter to increase its count; else, if TX gain is less than TX max, (f) applying a gain control signal to the transmitter that is derived from TX gain, and (g) disabling the counter from increasing its count.

24 Claims, 8 Drawing Sheets

SPREAD SPECTRUM RADIOTELEPHONE HAVING ADAPTIVE TRANSMITTER GAIN CONTROL

FIELD OF THE INVENTION

This invention relates generally to telecommunications apparatus and, in particular, to radiotelephones that are compatible with a code division, multiple access (CDMA) protocol.

BACKGROUND OF THE INVENTION

A direct-sequence or direct sequence coding spread spectrum communication technique in essence combines two digital signals, or bit streams, to create a third signal prior to transmission. The first signal is an information signal, such as the output of a digitized voice circuit. For example, the first signal may have a bit rate of 10 kb/s. The second signal is generated by a random-sequence, or pseudonoise (PN) generator, and is a stream of essentially random bits having a bit rate that is several orders of magnitude greater than the bit rate of the digitized voice signal. The modulation of these two signals results in the third signal having the same bit rate as the second signal. However, the third signal also contains the digitized voice signal. At the receiver, an identical random-sequence generator produces a random bit stream which mirrors the original random-sequence that was used for modulation at the transmitter. For proper operation, after carrier frequency de-modulation, the PN generator of the receiver must be synchronized to the incoming PN sequence. By removing the random sequence from the received signal and integrating it over a symbol period, a despread signal is obtained. Ideally, the despread signal exactly represents the original 10 kb/s voice signal.

The TIA/EIA Interim Standard, Mobile Station-Base Station Compatibility Standard for Dual-Mode Wideband Spread Spectrum Cellular System, TIA/EIA/IS-95 (Jul. 1993) specifies in Section 6.1.2 that a mobile station must provide two independent techniques for output power adjustment. These two techniques are an open loop estimation, based solely on mobile station operation, and a closed loop correction that involves both the mobile station and the cell site controller, or base station. In the latter technique the mobile station responds to power control bits received over a Forward Traffic Channel and adjusts its mean output power level in accordance with these bits. In the former technique a measurement of received signal strength from the base station is used to control the output power.

The power control in the CDMA system is also described at pages 10 and 12, and shown generally in FIG. 3–2, in a publication entitled "Introduction to CDMA and the Proposed Common Air Interface Specification (CAI) for a Spread Spectrum Digital Cellular Standard-An Overview of the Application of Code Division Multiple Access (CDMA) to Digital Cellular Systems and Personal Cellular Networks", QUALCOMM Incorporated, Mar. 28, 1992. As is described in this publication, the goal of the mobile station transmitter power control process is to produce, at a cell site receiver, a nominal received signal power from each mobile station transmitter that is operating within the cell. If all mobile stations are so controlled, the end result is that the total signal power received at the cell site from all of the mobile stations is equal to the nominal received power, times the number of mobile stations.

The following U.S. Patents and other publications pertain to the teaching of this invention. U.S. Pat. No. 5,168,505 to Akazawa et al., issued Dec. 1, 1992 and entitled "AUTOMATIC GAIN CONTROL DEVICE FOR SPREAD SPECTRUM COMMUNICATION DEVICE".

U.S. Pat. No. 5,107,225 to Wheatley, III et al., issued Apr. 21, 1992 and entitled "HIGH DYNAMIC RANGE CLOSED LOOP AUTOMATIC GAIN CONTROL CIRCUIT".

U.S. Pat. No. 5,099,204 to Wheatley, III, issued Mar. 24, 1992 and entitled "LINEAR GAIN CONTROL AMPLIFIER".

U.S. Pat. No. 5,093,840 to Schilling, issued Mar. 3, 1992 and entitled "ADAPTIVE POWER CONTROL FOR A SPREAD SPECTRUM TRANSMITTER".

U.S. Pat. No. 5,132,985 to Hashimoto et al., issued Jul. 21, 1992 and entitled "SPREAD SPECTRUM RECEIVER".

U.S. Pat. No. 5,056,109 to Gilhousen et al., issued Oct. 8, 1991 and entitled "METHOD AND APPARATUS FOR CONTROLLING TRANSMISSION POWER IN A CDMA CELLULAR MOBILE TELEPHONE SYSTEM".

U.S. Pat. No. 4,993,044 to Akazawa, issued Feb. 12, 1991 and entitled "SPREAD-SPECTRUM COMMUNICATION RECEIVER".

U.S. Pat. No. 4,901,307 to Gilhousen et al., issued Feb. 13, 1990 and entitled "SPREAD SPECTRUM MULTIPLE ACCESS COMMUNICATION SYSTEM USING SATELLITE OR TERRESTRIAL REPEATERS".

PCT International Application No. WO 93/10609, published 27 May 1993 and entitled "ADAPTIVE POWER CONTROL FOR A SPREAD SPECTRUM COMMUNICATIONS SYSTEM AND METHOD".

PCT International Application No. WO 93/07702, published 15 Apr. 1993 and entitled "TRANSMITTER POWER CONTROL SYSTEM".

PCT International Application No. WO 93/05585, published 18 Mar. 1993 and entitled "A METHOD FOR AUTOMATIC TRANSMISSION POWER CONTROL IN A TRANSCEIVER SUITABLE FOR A CDMA ENVIRONMENT EMPLOYING DIRECT SEQUENCE DIFFUSION".

PCT International Application No. WO 92/21196, published 26 Nov. 1992 and entitled "METHOD AND APPARATUS FOR CONTROLLING TRANSMISSION POWER IN A CDMA CELLULAR MOBILE TELEPHONE SYSTEM".

OBJECTS OF THE INVENTION

It is an object of this invention to provide a novel circuit arrangement and method that provides an adaptive transmitter power control.

It is another object of this invention to provide a method and a circuit arrangement that provides an adaptive transmitter power control function for use with a spread spectrum transmitter.

It is further object of this invention to provide for a technique to bias a transmitter of a spread spectrum transmitter to control the linearity over a range of transmitted powers.

SUMMARY OF THE INVENTION

The foregoing and other problems are overcome and the objects are realized by a method and a circuit arrangement in accordance with this invention. This invention teaches a method, and circuits that operate in accordance with the method, for adaptively controlling the transmitted power of a spread spectrum transmitter. The method includes the steps of: (a) setting a register such as a counter with an estimate of a maximum transmitter gain signal, the counter having an count output that is a representation of a maximum transmitter gain signal TX max; (b) deriving a transmitter gain signal TX gain from a received CDMA signal; (c) comparing TX max to TX gain and, if TX gain is greater than TX max, (d) applying a gain control signal to the transmitter that is derived from TX max, and (e) enabling the counter to increase its count; else, if TX gain is less than TX max, (f) applying a gain control signal to the transmitter that is derived from TX gain, and (g) disabling the counter from increasing its count.

The method further includes the steps of: (h) generating a reference transmitted power signal indicator TXPI ref; (i) generating, as a function of an actual transmitted power, a transmitted power signal indicator TXPI; (j) comparing TXPI to TXPI ref and, if TXPI greater than TXPI ref, (k) causing the counter to count down without regard for whether TX max is greater than or less than TX gain; (l) else, causing the counter to count up, so long as TX gain is greater than TX max.

The method further includes a step of selectively applying a control signal TX ON to the counter to enable the counter to count up or to count down only when the transmitter is transmitting. This step is useful for enabling the counter operation only when a burst of CDMA information is transmitted.

The method also include a step of selectively applying a control signal Mode Control to cause only a gain control signal that is derived from TX max to be applied to the transmitter. This latter step is useful when operating the radiotelephone in an analog (FM) mode.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
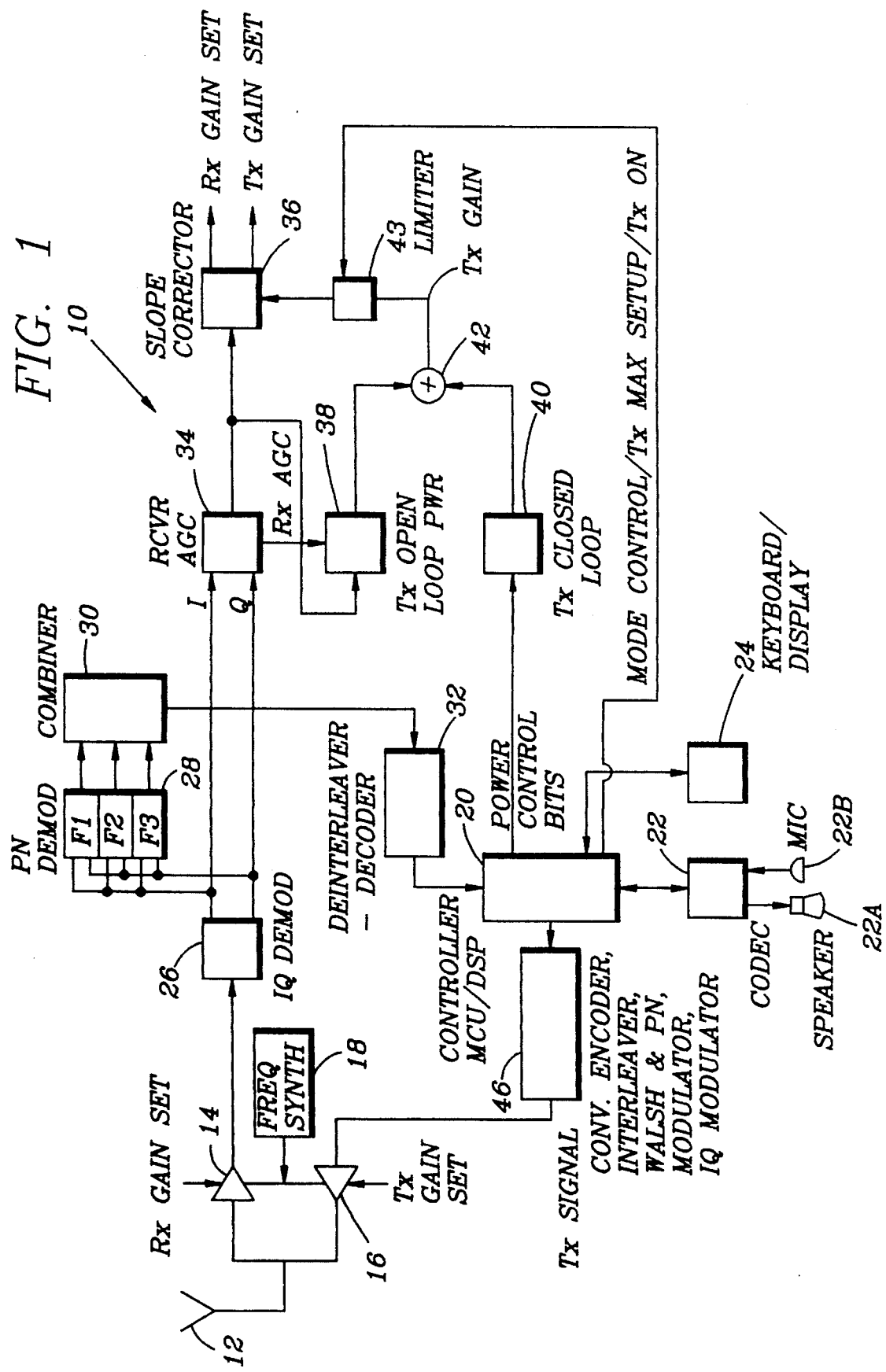
FIG. 1 is a block diagram of a radiotelephone that is constructed and operated in accordance with this invention.

Referring to FIG. 1 there is illustrated a presently preferred embodiment of a spread spectrum radiotelephone 10 in accordance with this invention. As will become apparent, certain ones of the blocks of the radiotelephone 10 may be implemented with discrete circuit elements, or as software routines that are executed by a suitable digital data processor, such as a high speed signal processor. Alternatively, a combination of circuit elements and software routines can be employed. As such, the ensuing description is not intended to limit the application of this invention to any one particular technical embodiment. In the preferred embodiment of this invention the spread spectrum radiotelephone 10 operates in accordance with the TIA/EIA Interim Standard, Mobile Station-Base Station Compatibility Standard for Dual-Mode Wideband Spread Spectrum Cellular System, TIA/EIA/IS-95 (Jul. 1993). However, compatibility with this particular interim standard is not to be considered a limitation upon the practice of this invention.

The radiotelephone 10 includes an antenna 12 for receiving RF signals from a cell site, hereafter referred to as a base station (not shown), and for transmitting RF signals to the base station. When operating in the digital (spread spectrum or CDMA) mode the RF signals are phase modulated to convey speech and signalling information. Coupled to the antenna 12 are a gain controlled receiver 14 and a gain controlled transmitter 16 for receiving and for transmitting, respectively, the phase modulated RF signals. A frequency synthesizer 18 provides the required frequencies to the receiver and transmitter under the control of a controller 20. The controller 20 is comprised of a slower speed MCU for interfacing, via a codec 22, to a speaker 22a and a microphone 22b, and also to a keyboard and a display 24. In general, the MCU is responsible for the overall control and operation of the radiotelephone 10. The controller 20 is also preferably comprised of a higher speed digital signal processor (DSP) suitable for real-time processing of received and transmitted signals. The received RF signals are converted to base band in the receiver and are applied to a phase demodulator 26 which derives in-phase (I) and quadrature (Q) signals from the received signal. The I and Q signals are converted to digital representations by suitable A/D converters and applied to a three finger (F1-F3) demodulator 30, each of which includes a local PN generator. The output of the demodulator 28 is applied to a combiner 30 which outputs a signal, via a deinterleaver and decoder 32, to the controller 20. The digital signal input to the controller 20 is expressive of speech samples or signalling information. The further processing of this signal by the controller 20 is not germane to an understanding of this invention and is not further described, except to note that the signalling information will include transmitter power control bits that are sent from the base station as a continuous stream to the radiotelephone 10.

The I and Q signals output from the I-Q demodulator 26 are also applied to a receiver AGC block 34 which processes same to produce an output signal to an amplifier slope corrector block 36. One output of the slope corrector block 36 is the RX GAIN SET signal which is used to automatically control the gain of the receiver 14.

The output of the receiver AGC block 34 is also applied to a TX open loop power control block 38. A TX closed loop control block 40 inputs the received transmitter power control bits from controller 20. An adder 42 adds the output of the TX open loop control block 38 to the output of the TX closed loop control block 40 and generates a sum signal which is the TX-GAIN signal that is selectively applied, via a limiter 43 (FIGS. 7 and 8), to the transmitter 16 to control the output power thereof. Preferably this signal is slope corrected as required for the transmitter amplifier.

An input to the transmitter 16 (vocoded speech and/or signalling information) is derived from the controller 20 via a convolutional encoder, interleaver, Walsh modulator, PN modulator, and I-Q modulator, which are shown generally as the block 46.

Figure 2:
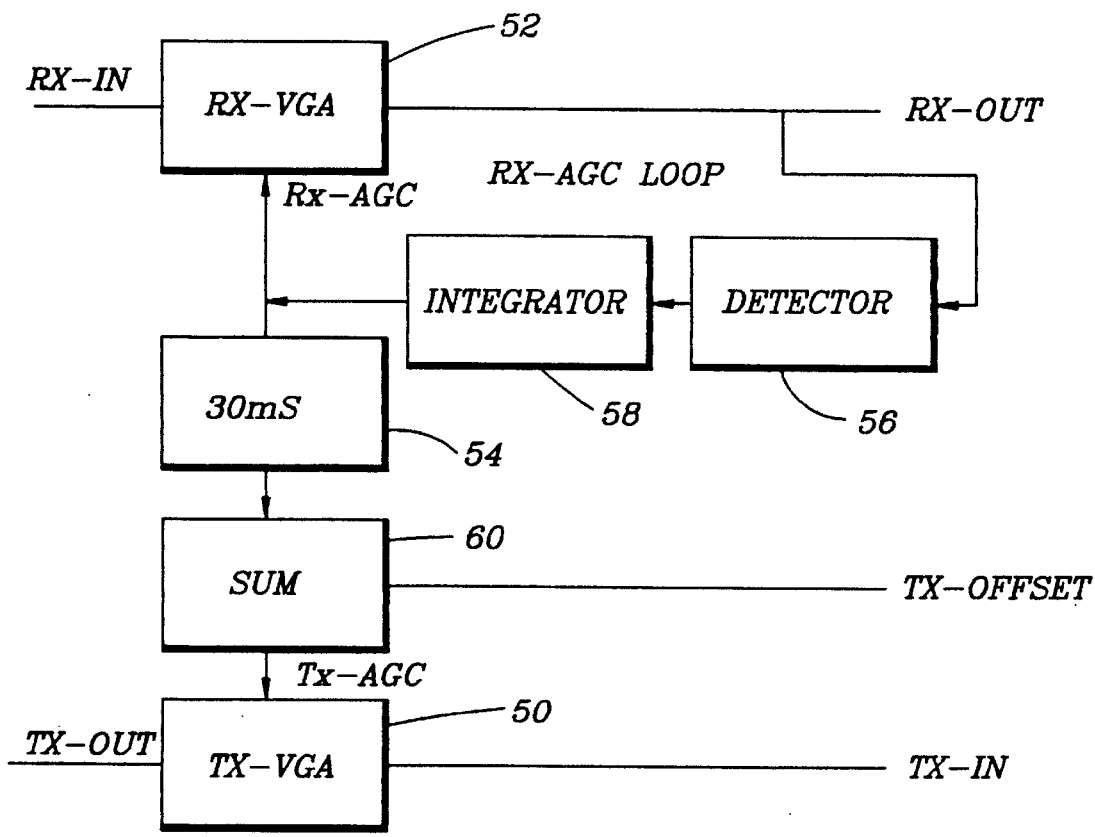
FIG. 2 is a simplified overall block diagram of a spread spectrum receiver/transmitter AGC system.

FIG. 2 is a high level block diagram of the spread spectrum AGC system. A purpose of the receiver AGC is to optimize the received signal level before A/D conversion, while having sufficient speed to follow signal fades. The transmitter power is linked to the received power accordingly to the formula:

$$TX\_out\_dBm = -RX\_in\_dBm - 73dB + \text{offset},$$

limited within the TX power range [−49 to +23 dBm].

As a result, for the open loop power control case a 1 dB increase in the received signal power level causes the TX power level to be decreased by 1 dB.

The Tx-offset is used to change the TX power so that all mobile stations transmitting on the same channel are received at the base station at the same signal strength. To achieve the required closed loop control, the base station controls the offset of each mobile by sending a constant bit stream (power control bits) which command the mobile to increase or decrease the offset value. In accordance with the IS-95 Interim Standard the offset can be changed by ±−1 dB every 1.25 ms.

The transmit power can be linked to the received signal level by using the same variable gain amplifier (VGA) 50 in the transmitter as the VGA 52 in the receiver. For this case, and for a 1 dB increase in receiver gain, the TX gain is correspondingly increased 1 dB. The 30 ms block 54 is an RC lowpass filter with a 30 ms time constant. The filter block 54 is used so that the transmitter can follow the average RX-level, and not the fast fading. A detector 56 is used to detect the received signal level, which is then integrated by block 58 to form the Rx AGC signal. The Rx AGC signal is also applied to the filter 54, and the filtered AGC signal is summed at block 60 with the Tx offset signal that is derived from the power control bits. The output of the sum block is the Tx AGC signal which is applied to the Tx VGA 50.

In accordance with the IS-95 Interim Standard the specifications for the gain control system depicted in FIG. 2 are as follows: RX-VGA control range is minimum −105 dBm to −25 dBm (80 dB), TX-VGA control range is minimum −50 dBm to +23 dBm (73 dB, portable), the open loop power estimate should be within ±6 dB and shall be within ±9 dB of the actual received power, the TX-offset range is a minimum of ±32 dB, the accuracy of the 30 ms time constant shall be better than ±20%.

For a change (dPin) in the RX level of ±20 dB or less, the TX power must be within the limits:

(a) upper limit: for 0<t<24 ms: MAX [1.2*|dPin|*(t/24), |dPin|*(t/24)+0.5 dB ]for t>24 ms: MAX [1.2*|dPin|, |dPin|+0.5 dB]

(b) lower limit: for t>0: MAX [0.8*|dPin|*(1-exp{(1.25-t)//36})- 0.5 dB, 0], where dPin is in dB and t is in milliseconds. As an example, for an received signal change=20 dB=>TX change=20 dB+/−4.5 dB.

The TX offset must change the TX power in 1 dB steps, and the accuracy must be better than ±20% or ±0.5 dB within any 10 dB TX offset range. By example, a 5 dB TX offset change=>5 dB±1 dB TX power change, and a 1 dB TX offset change=>1 dB ±0.5 dB TX power change.

And finally, following a 1 dB step change in the TX offset, the TX-power must be within 0.3 dB of the final value in less than 500 microseconds.

This invention teaches an AGC system (Rx and Tx) that meets the requirements imposed by the foregoing specification.

A function of the signal strength detector 56 is to measure the power of the received spread spectrum signal. It is not required to directly measure the received power so long as the measurement has a constant relationship to the received power. The detector 56 preferably has a ±20 dB dynamic range in order to fulfill the step response specifications (up to ±20 dB RX step). The output of the amplifier 52 driving the detector also preferably has a ±20 dB dynamic range. With less than a ±20 dB dynamic range the step response will be delayed, although this may be acceptable for certain implementations.

A number of different detector embodiments may be employed with this invention, including a logarithmic detector, an absolute value detector, an RMS power detector, and an approximating detector. Each is now described.

The output of a logarithmic detector is: Vdet= Average(log(|Vsignal|)). This detector works well for signals without AM modulation (e.g., FM modulation). With AM modulation the log-function will tend to distort the AM information and, as a result, the detector 56 may measure too low a signal strength. The advantage of the logarithmic detector is that it has a wide dynamic range (80–100 dB). The logarithmic detector can be used at IF (not base band) for receiving a spread spectrum signal with the following assumptions. With more than 10–20 users it can be assumed that the forward link I and Q components are gaussian distributed (without fading). The AM information (=sqrt[$I^2$+ $Q^2$]) will then be Rayleigh distributed. The Rayleigh distribution has a low density at low levels. As a result, the logarithmic distortion will not have a significant impact on accuracy. With fewer users the ratio between detector output and input power will change, and the detector will measure a lower power level. If the detector is used at base band, only the I or Q channel is used for input to the detector.

The output of the absolute value detector is given by the expression: Vdet=Average(|Vsignal|). This detector works well with gaussian distributed signals such as the CDMA I and Q signals at base band (forward link). With a changing distribution (fewer users) the absolute value detector may out-perform the logarithmic detector. Although this detector has a smaller dynamic range than the logarithmic detector, the range is sufficient for the spread spectrum application which is of the most concern to this invention.

The output of the RMS power detector is: Vdet=Average(Vsignal$^2$). This is an optimum detector because it measures true power, however it is difficult to implement in a practical manner. Furthermore, the squaring function transforms a 40 dB range to an 80 dB range, which adversely impacts the noise performance of the detector.

An approximating detector is presently preferred in the digital AGC detector that is described below. This detector yields an optimum detector performance with a low gate count.

Figure 3:
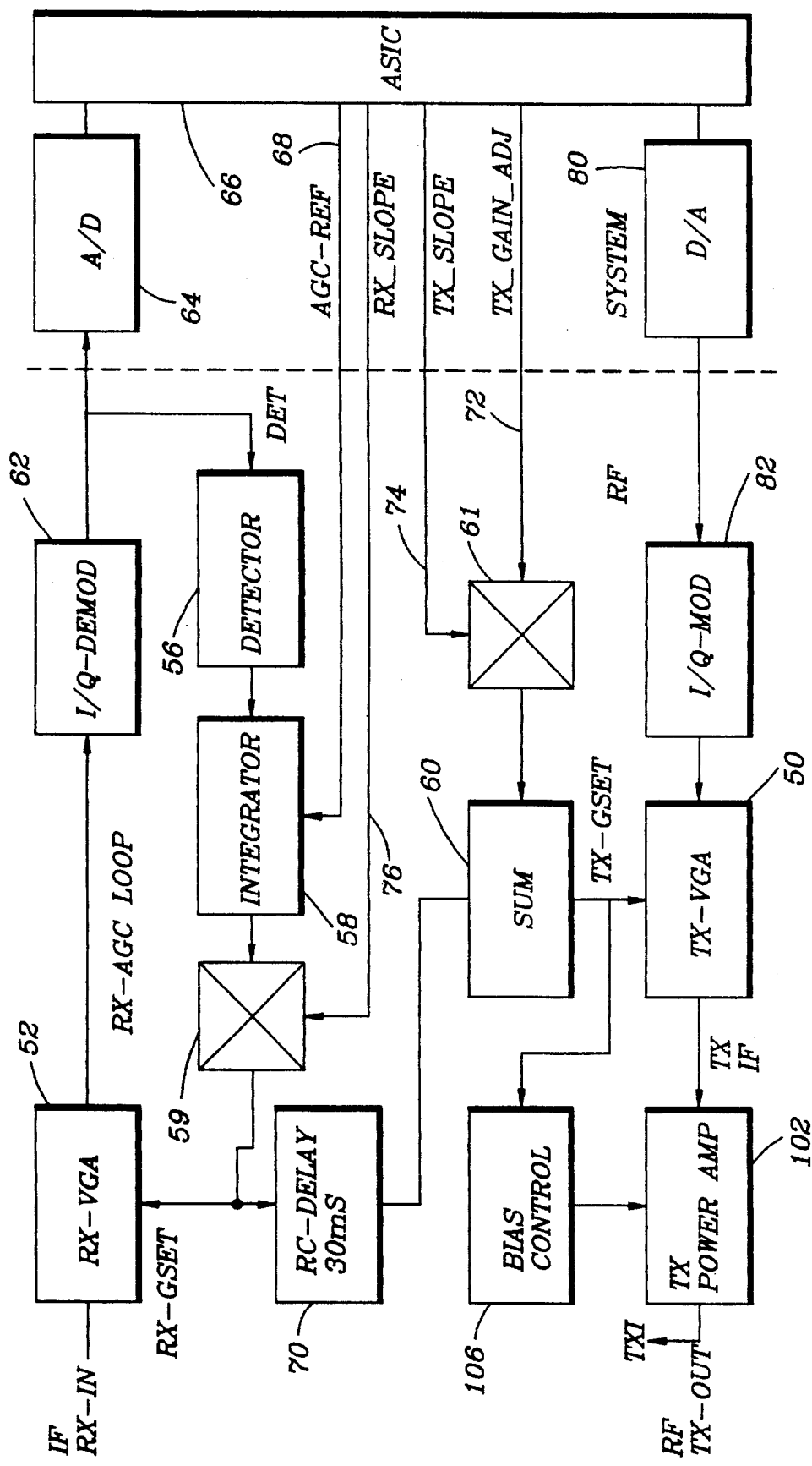
FIG. 3 is a simplified block diagram of an analog embodiment of the receiver/transmitter AGC system.

Reference is now made to FIG. 3 for a description of a CDMA analog AGC system. The RX gain control is comprised of two loops. The first loop is essentially analog and comprises the RX-VGA 52, I/Q demodulator 62, detector 56, and integrator 58. The first loop is used for coarse AGC setting. The second loop is essentially digital and comprises the RX-VGA 52, I/Q modulator 62, A/D converter 64, digital control block 66, AGC-REF signal 68, and the integrator 58. The AGC-REF signal 68 is a feedback signal from the digital loop to the integrator 58. The second, digital loop is used to correct offset errors in the first, analog loop. In the circuit of FIG. 3 the RX-VGA 52 and TX-VGA 50 each have a variable gain range of 80 dB, the integrator 58 sets the time constant for the analog loop, and the detector 56 is implemented as a logarithmic absolute value detector where:

$$Vout=\log(AVG|Vin|),$$

where AVG|Vin| is the average of the absolute value of Vin. The time constant for the detector 56 is 10% of the time constant of the analog loop.

The block RC-DELAY 70 is comprised of an RC circuit with a time constant of 30 ms. As a result, the TX-VGA 50 tracks the RX-VGA 52 with a 30 ms time constant delay.

The TX_GAIN_ADJ signal 72 is used, in conjunction with the multiplier 61 and the TX_SLOPE signal 74, to offset the gain of the TX-VGA 50 from the gain of the RX-VGA 52. The magnitude of TX_GAIN_ADJ signal 72 is controlled by the base station by the power control bits. A minimum resolution of a D/A converter (not shown) that generates the TX_GAIN_ADJ signal is preferably equivalent to a 1 dB gain change. The TX_SLOPE signal 74 is used to correct the slope of the TX-VGA 52 in reference to the TX_GAIN_ADJ signal. This signal is required in order to accurately translate a given change in the TX_GAIN_ADJ signal 72 into a given change in TX power, and thus is useful in compensating for variations between VGAs.

The RX_SLOPE signal 76 is the complementary receiver-side signal to the TX_SLOPE signal 74, and is used for compensation purposes for correcting the slope of the RX-VGA 52 so that it essentially matches the slope of the TX-VGA 50. The multiplier 59 is used to multiply the RX_SLOPE signal 76 by the output of the integrator 58.

The multiplier 61 multiplies the TX_SLOPE signal by the TX_GAIN_ADJ signal, and supplies the product to the summer 60 for addition to the output of the RC-DELAY block 60 to form the TX_AGC signal, shown in FIG. 3 as the transmitter gain control signal TX-GSET. An input of the TX-VGA 50 is supplied with information to be transmitted from a D/A converter 80 and an I/Q modulator 82.

A bias control block 106 also receives the TX-GSET signal and is used to generate a bias signal for a TX power amplifier 102. The operation of the blocks 102 and 106 is described in greater detail in FIGS. 9 and 11.

Figure 4:
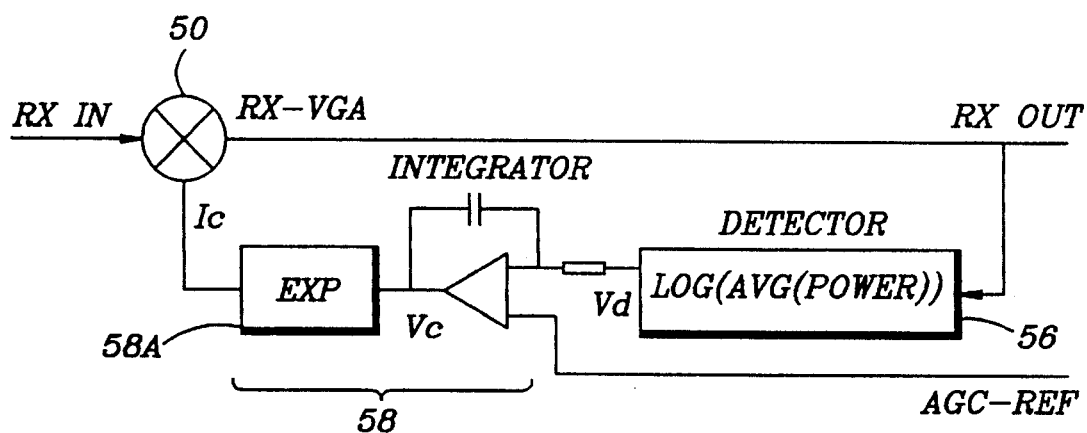
FIG. 4 is a diagram that illustrates in greater detail the receiver portion of the analog AGC system of FIG. 3.

FIG. 4 is a block diagram that shows in greater detail the RX-AGC circuits of FIG. 3. The transfer function for the exp block 58a is:

$$Ic=\exp{(VC)} \text{ or } VC=\log[Ic].$$

The RX-VGA 52 functions as a multiplier so that:

RX_out=Ic RX_in, where Ic is the gain control signal, in dB format:

LOG[Rx_out]=Log[Ic]+Log[RX_in] or dBout=Vc+dBin.

The detector block 56 measures RX-out in dB so:

$$Vd=k1\cdot\log[P(RX\_out)]=k1\cdot dBout=k1\cdot(Vc+dBin),$$

where k1 is a scaling constant.

As a result, by measuring RX_in and RX_out in dB (log), and by using the exp block 58a, the loop is made linear.

The integrator 58 operates in such a manner as to set the gain so that Vd=AGC-REF. The transfer function for the integrator is:

$$Vc(s)=Vd(S)/(s\tau),$$

where τ is the integration time constant.

By combining the RX-VGA 52 and the exp block 58a, and adding a scaling constant k2, there is obtained:

$$dBout=dBin+k2\cdot Vc.$$

The AC loop gain T(s) is then:

$$T(s)=k1\cdot k2/(s\tau)=1/(s\tau2), \text{ where } \tau2=\tau/(k1\cdot k2).$$

The AGC transfer function is thus:

$$dBout/dBin=s\tau2/(1+\tau2),$$

which is equivalent to a single pole high pass filter with a time constant of τ2.

Figure 5:
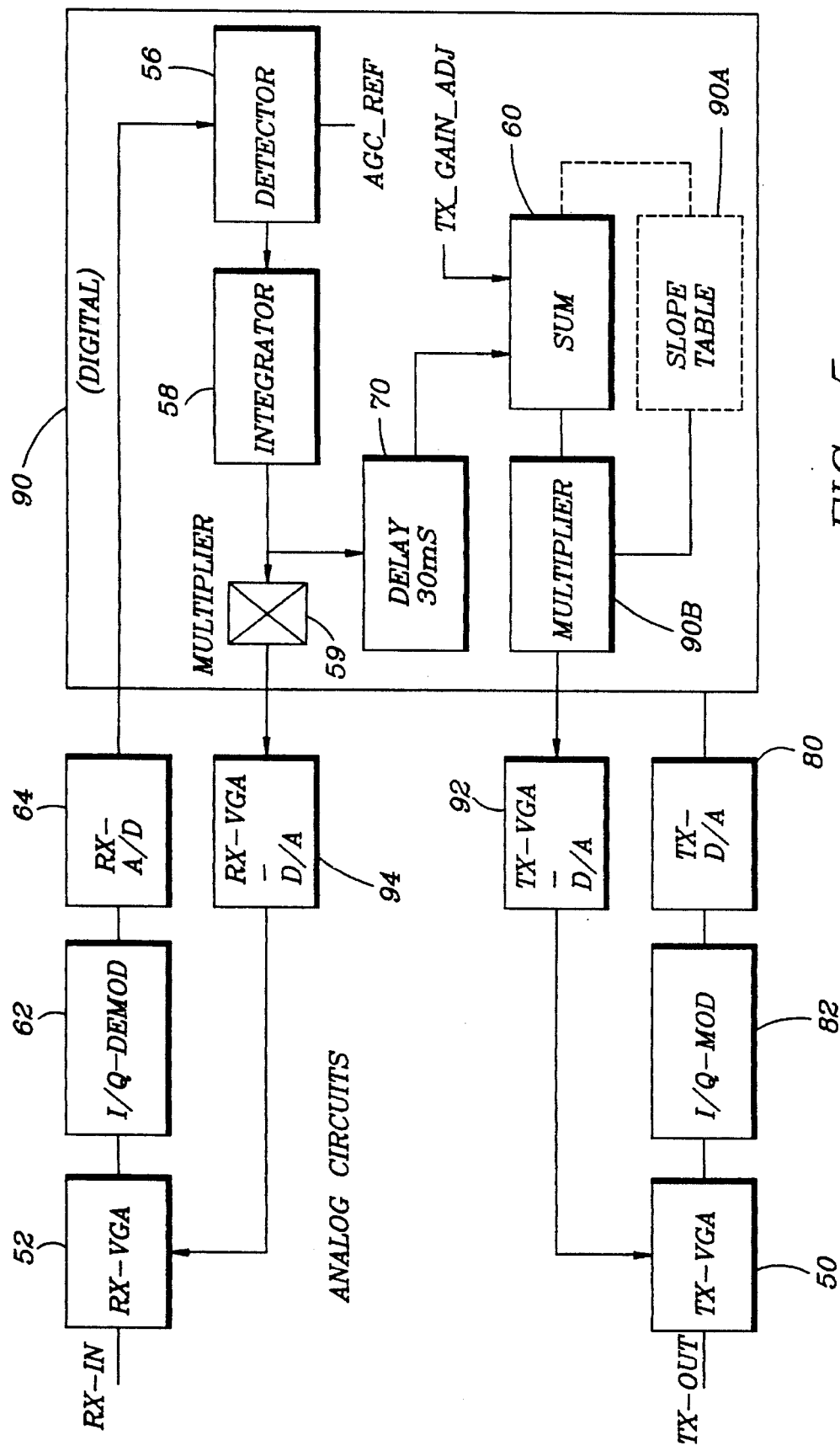
FIG. 5 is a block diagram showing a digital implementation of the AGC system.
Figure 6:
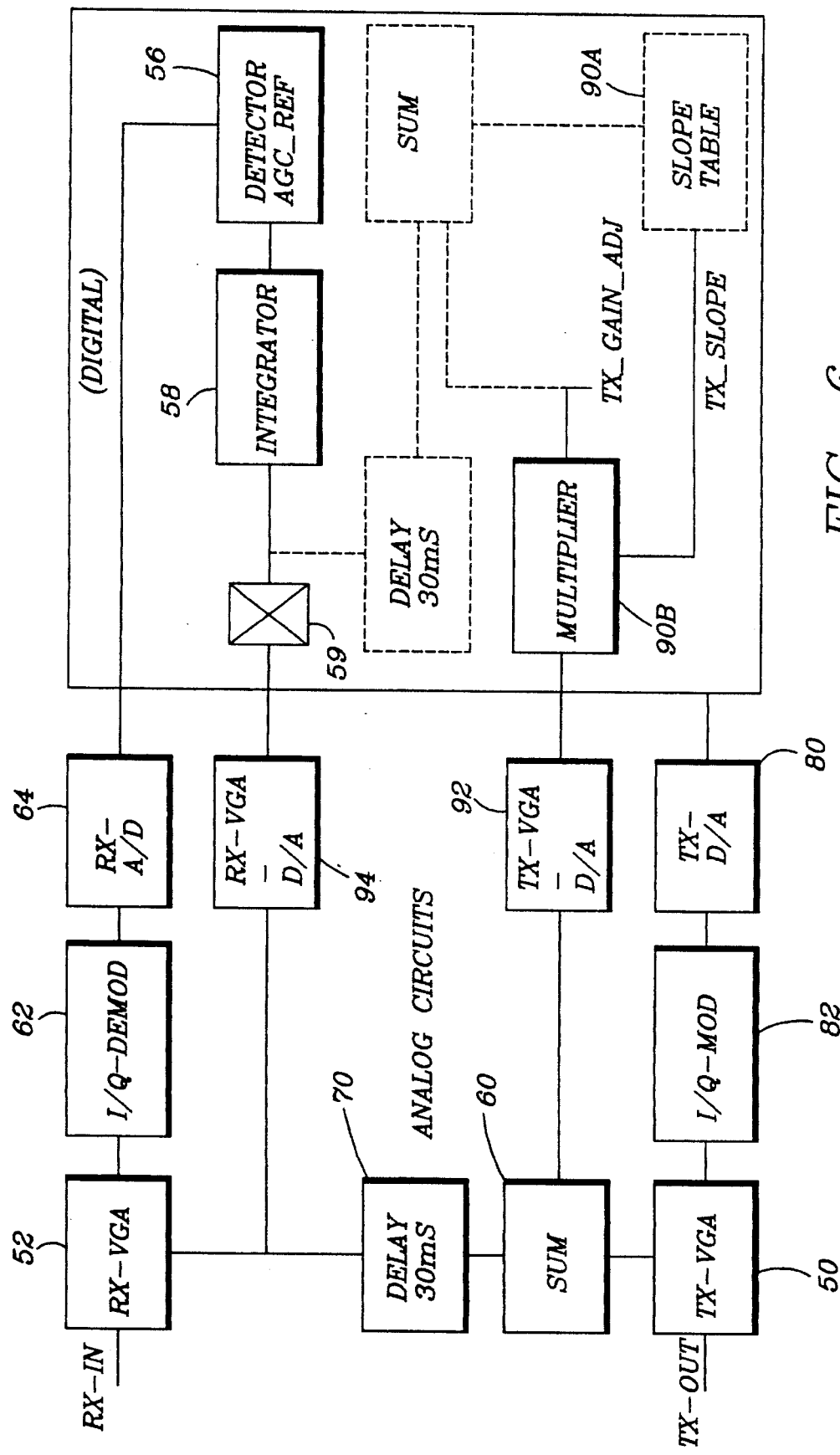
FIG. 6 is a block diagram illustrating the digital AGC system of FIG. 5 that is modified to include analog transmitter/receiver tracking.
Figure 7:
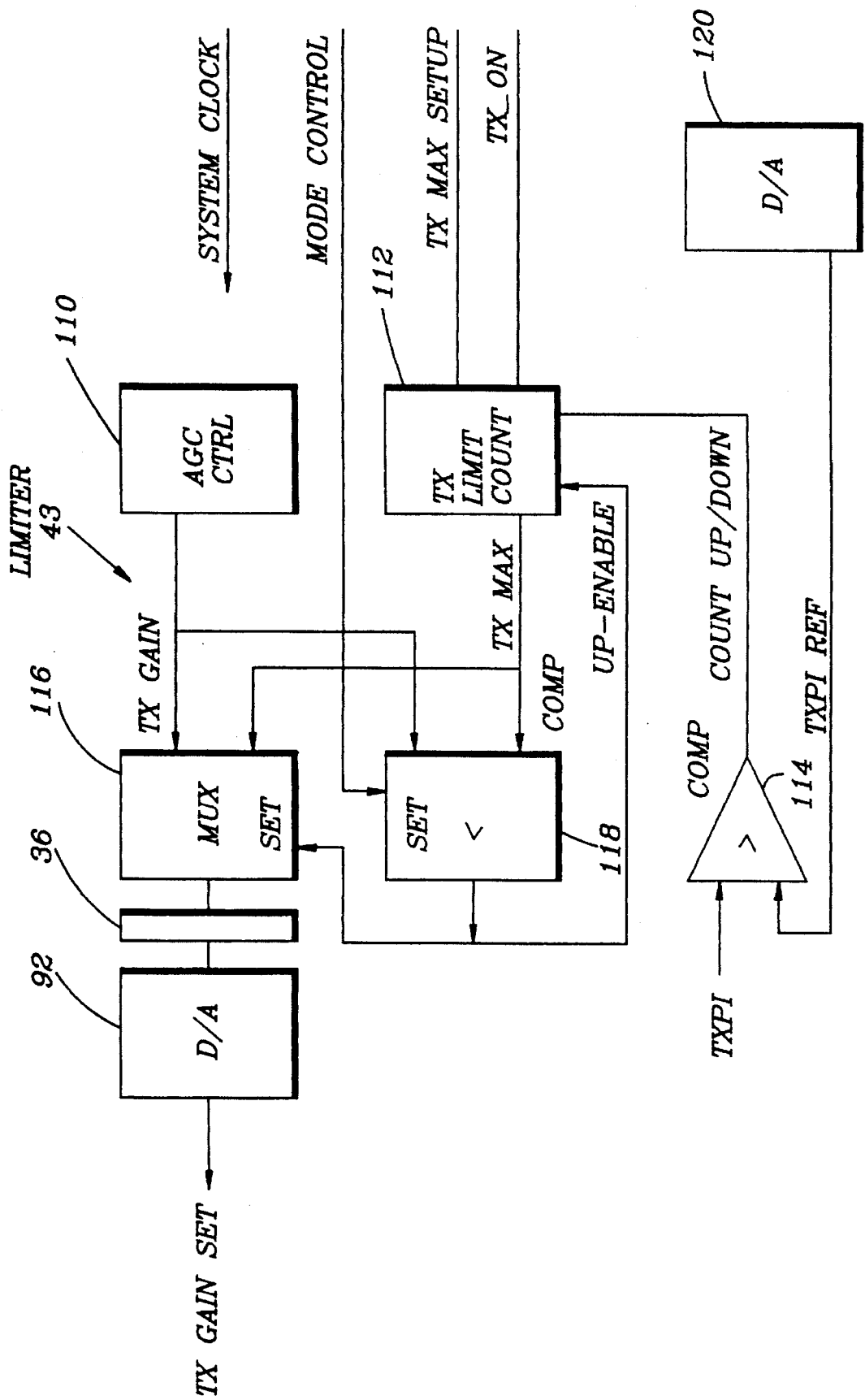
FIG. 7 is a block diagram of a digital embodiment for achieving direct AGC control with adaptive feedback.

Reference is now made to FIGS. 5, 6 and 7 for a description of the digital AGC system.

FIG. 5 is a block diagram that illustrates a first embodiment of the digital AGC system, specifically an all digital AGC control system. The two variable gain amplifiers VGAs 50 and 52 are controlled directly from the digital block 90. In a presently preferred embodiment of this invention the digital block 90 is embodied within an Application Specific Integrated Circuit (ASIC). It should be realized that discrete integrated circuits could be used as well, as could a suitably programmed high speed processing device. The detector 56, integrator 58, multiplier 59, summer 60 and delay 70 of FIG. 3 are implemented as digital circuits within the digital block 90.

The VGAs 50 and 52 may be either stepped VGAs controlled digitally, or continuously variable VGAs controlled by the outputs of suitable D/A converters. The latter approach, which is preferred, is illustrated in FIG. 5 as the TX-VGA-D/A 92 and the RX-VGA-D/A 94. The accuracy of gain of the each VGA is set by the associated controlling D/A converter 92 and 94, and by the linearity of the VGA control slope. The slope nonlinearity is correctable by the digital block 90. The gain increment size for the RX-VGA 52 is determined by the dynamic range of the RX-A/D converter 64, and is preferably not smaller than 1 dB in order to limit the number of required bits for the RX-VGA-D/A converter 94. The gain increment size for the TX-VGA 50 is a maximum of 0.75 dB, in accordance with the current IS-95 Interim Specification. In order for the TX power level to track the RX power level, the RX power level is measured with better than 0.05 dB resolution.

Correction of the VGA slopes can be accomplished either by multiplication or by table look up. A look up table (90a) is not presently preferred due to the required number of gates to implement the storage registers for the look up values.

In the preferred embodiment the multiplier 90b can use either analog or digital techniques. Analog multiplying requires a separate D/A to set the reference voltage for the primary D/A 92. Although a digital multiplier requires some number of gates to implement, a digital multiplier is presently preferred because of reduced complexity over the analog approach. Correction of nonlinear slope (change in slope vs. gain) is accomplished for the VGA 50 by using the three most significant bits of the TX gain word to select one of five scaling words. This provides five ranges of 16 dB, each of which can be individually scaled. The number of bits for each scaling word is a function of the desired range and resolution.

FIG. 6 shows a further embodiment of the invention wherein the digital AGC is provided with analog TX/RX tracking. Compared to FIG. 5, the delay block 70 and summer block 60 are moved outside the digital block 90, and are implemented with analog circuits as in FIG. 3. As a result, the accuracy of RX-VGA-D/A 94 does not contribute to the TX gain setting accuracy. The TX-VGA-D/A 92 provides a minimum of 1 dB resolution with ±0.5 dB accuracy over a ±32 dB range.

The digital AGC with analog TX/RX tracking embodiment of FIG. 6 is similar to the analog AGC system of FIG. 3. Major differences are that the detector 56 and integrator 58 are implemented digitally (as in FIG. 5), and that the nonlinear slope of the TX-VGA 52 is correctable.

Figure 9:
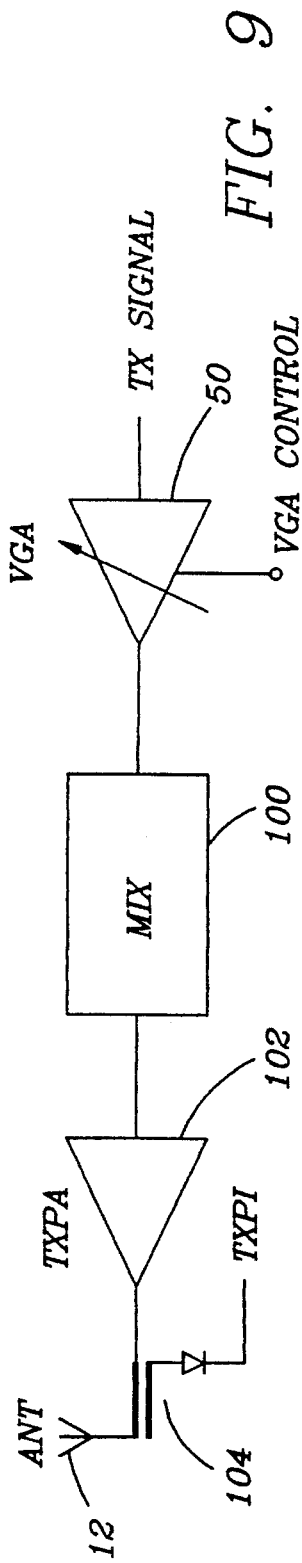
FIG. 9 is a simplified block diagram of a spread spectrum transmitter having a variable gain amplifier.

Reference is now made to FIG. 9 for showing in greater detail an embodiment of the transmitter circuitry, including the TX-VGA 50. The function of the transmitter output power control circuit, when operating in the spread spectrum CDMA mode, is to limit the maximum output power so that the transmitter power amplifier 102 operates in the linear mode.

For a dual mode (CDMA digital/FM analog) radiotelephone the same circuitry is preferably also used to set the transmitter power level when operating in the analog mode. The output power is controlled by using the TX-VGA 50 before the final transmitter power stage (102).

Figure 10:
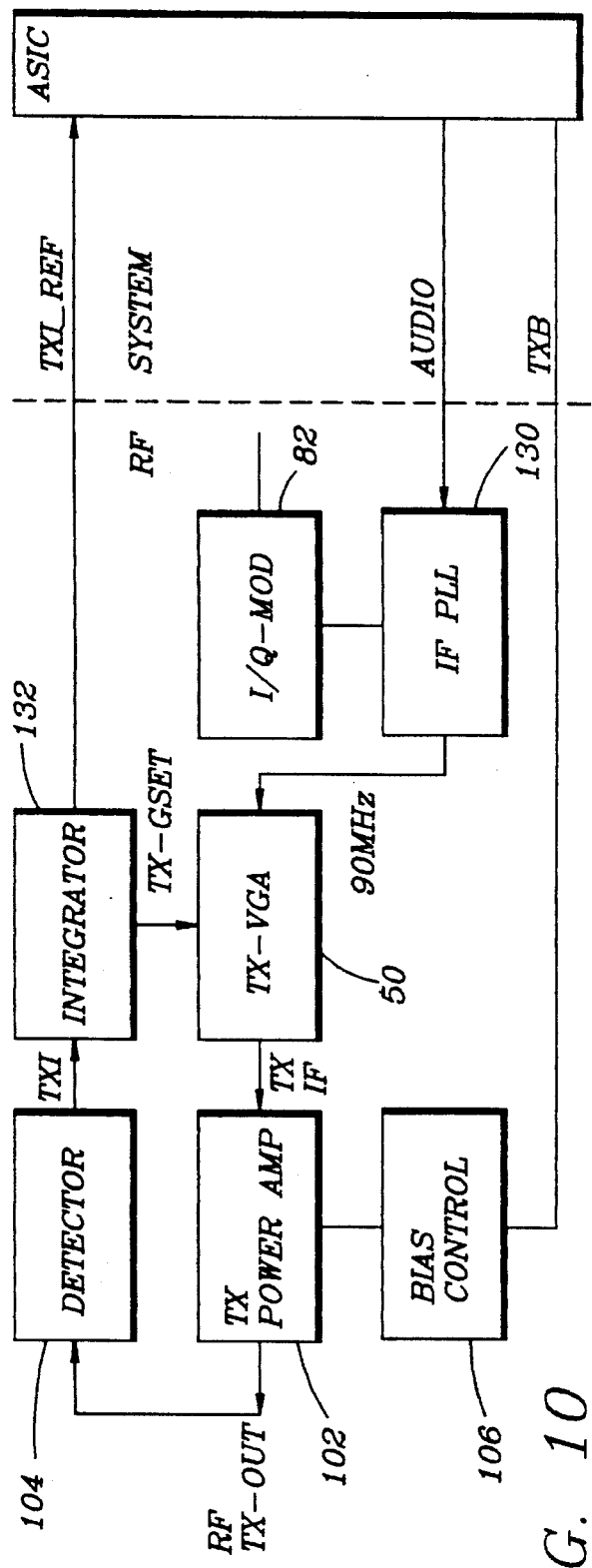
FIG. 10 depicts a circuit configuration for achieving transmitter power control when operating in an analog (FM) mode.

This is shown in FIG. 10, wherein the RX-AGC is not activated, the TX-VGA 50 is controlled by an analog AGC signal, and the I/Q modulator 82 is not used. An audio signal is used to control the output frequency of an IF phase locked loop (PLL) 130 which generates a 90 MHz FM signal. The output of the IF PLL 130 is applied to the input of the TX-VGA 50. In this mode of operation the bias signal for the TX power amplifier 102 is changed only to compensate for temperature variations. This differs from the bias control employed when operating in the digital (spread spectrum) mode, as will be detailed below with respect to FIG. 11.

Referring again to FIG. 9, when operating in the spread spectrum mode the maximum output power can be limited by limiting the VGA 50 control voltage to a predefined level. This is a simple method but is inherently inaccurate, due to a possible large variation in gain for a given VGA control level.

Alternatively, using a feedback control method a TX power indicator 104 generates an output signal TXPI which is used to limit the maximum output power. When the magnitude of TXPI is greater than a given set point the VGA control signal is modified so that the TX output power is equal to the set point. This is preferably accomplished with nonlinear feedback.

Although this technique is relatively simple to implement for a continuously transmitted signal, for variable data rate spread spectrum transmissions this method is too slow to limit the maximum output power. That is, in the CDMA mode each TX burst can be at a different power level than the previous burst, because of the open loop power control wherein the RX level is used to estimate the TX level. As a result, the TX power amplifier 102 may saturate in the beginning of each burst until the TXPI indicator 104 settles the TXPI signal. If the TXPI signal response is made too fast, the TX power estimate may include excessive noise.

A presently preferred technique to achieve transmitter output power control is shown in FIG. 7, wherein the limiter 43 of FIG. 1 is shown in greater detail. This technique is referred to herein as a direct control method with adaptive feedback. Generally, when power limiting is activated the set point for limiting is modified until the magnitude of the TXPI signal is approximately equal to a TXPI set point. A direct control set point is used as a first estimate, and TXPI is subsequently used to adaptively update this set point. Although this method may saturate the TX power amplifier 102 (FIG. 9), this will only occur during the first few milliseconds of a new call.

FIG. 7 shows a digital implementation of the direct control method with adaptive feedback. The system clock signal is employed to synchronize all of the circuits. The TX-GAIN-SET signal sets the gain of the transmitter VGA 50 and, as a result, the transmitter output power. For this description it is assumed that an increase in TX-GAIN-SET causes an increase in transmitter gain and power. As in FIG. 9, the TXPI signal is a measurement of the transmitter power at the output. For this description it is assumed that an increase in transmitter power causes an increase in the magnitude of TXPI signal.

The AGC Ctrl block 110 is a control circuit that sets the transmitter output power in the spread spectrum mode. The AGC Ctrl block 110 may function in a manner depicted in FIG. 2 of commonly assigned U.S. patent application Ser. No. 08/312, 813, filed Sep. 27, 1994, entitled "Digital AGC for a CDMA Radiotelephone" by Kjell Östman Reference in this regard can also be made to U.S. Pat. No. 5,107,225 which presents a different solution and implementation.

In the preferred embodiment the TX-GAIN signal is derived from a combination of open loop power control circuit 38 and the closed loop power control circuit 40, wherein the open loop portion generates a signal that is derived from the received signal level, and wherein the closed loop portion includes the contribution of the power control bits that are transmitted continuously from the base station (see FIG. 1). The TX-GAIN signal is applied to the limiter block 43, which is shown and described herein with respect to FIGS. 7 and 8.

In FIG. 7, the transmitted power is set by controlling the gain in the transmitter with the TX-GAIN signal. The TX limit register or counter 112 generates a signal TX-MAX which represents a maximum value of the TX-GAIN signal. The Setup input is used to preset the counter 112 with a Setup estimate of the maximum value of the TX-GAIN signal. When the signal TX_ON is active the counter 112 counts up or down on each system clock, depending on the state of Count up/down signal provided from a comparator 114. When the signal up-enable is not asserted, the counter 112 will only count down. When the signal up-enable is asserted, the counter 112 is enabled to also count up. The multiplexer (MUX) 116 is employed to select either the TX-GAIN signal or the TX-MAX signal as the gain control for the TX-VGA 50, via the slope corrector (shown generally in FIG. 2 as the block 36) and the TX-VGA-D/A 92 (FIGS. 5 and 6). A digital comparator 118 operates in such a manner that when TX-Gain is greater than TX-MAX: (a) the TX limit counter 112 is enabled (with signal up-enable) to count up, and (b) the select (Sel) input of the MUX 116 is controlled to select TX-MAX. Otherwise the counter 112 only counts down, and the TX-GAIN digital signal is selected by the MUX 116.

The before-mentioned comparator 114 determines if the TX limit counter 112 counts up or down. If TXPI is higher than TXPI-ref, the counter 112 counts down, otherwise, it counts up (if enabled by TX-ON). The TXPI and TXPI-ref inputs to the comparator 114 are analog, and the output signal count up/down is digital (high or low). The D/A 120 is used to generate the analog reference level of TXPI-ref.

The Mode Control input signal forces the digital comparator 118 to enable the limit mode as if TX-GAIN was higher than TX-MAX. This input is useful when operating the radiotelephone in the FM analog mode, where the transmitter power is controlled by TX-MAX. TX-MAX settles to a value where TXPI is equal to TXPI-ref and, as a result, TXPI-ref defines the transmitter power level.

When the transmitter output power is less than the maximum, the power is controlled by the AGC control block 110 (power is set by the gain in the transmitter). The power limiting is enabled either by TXPI being greater than TXPI-ref, or if TX-GAIN is higher than TX-MAX. If TXPI is higher than TXPI-ref the TX_limit counter 112 counts down, thereby decreasing TX-MAX, until TX-GAIN is higher than TX-MAX. When TX-GAIN is higher than TX-MAX it is assumed that the transmitter power has passed the maximum limit. This condition causes the comparator 118 to switch the multiplexer 116 so that the transmitter power is set by the current value of TX-MAX, and it simultaneously enables the TX-limit counter 112 to also count up (without the up-enable signal being asserted it can only count down).

TX-MAX is an estimate of the maximum gain needed to set maximum power. Due to temperature variations of the transmitter gain TX-MAX is optimized for different temperatures to determine the relationship between gain and output power. The adaptive adjustment of TX-MAX is done with TXPI, which is a measurement of the actual transmitter output power. If TXPI is less than TXPI-ref, the output power is less than maximum if TX-GAIN>TX-MAX. In this case the TX-limit counter 112 is incremented until TXPI is higher than TXPI-ref. In this manner TX-MAX is adaptively updated until it represents the maximum output power. If TXPI is initially less than TXPI-ref the TX-limit counter 112 counts down instead of up. The counter 112 does ]lot stop counting so long as TX-GAIN is higher than TX-MAX. As a result, and when the circuit has stabilized, the TX limit counter 112 oscillates between two levels. That is, if TXPI is higher than TXPI-ref the counter 112 counts down by one count and thereby decreases the transmitter power and TXPI. On the next clock TXPI may be lower than TXPI-ref. As a result the counter 112 counts up by one count, bringing the counter 112 back to the previous state, and the cycle repeats.

The TX-ON signal is used to indicate if the TXPI measurement is valid. If the transmitter is operated in burst mode (transmitter turned on/off for short periods of time as in the TDMA and CDMA cellular standards) the TXPI indicator does not measure any power during an off period. TX-ON is thus used to disable up/down counting when the transmitter is off. However, the previous TX limit count is maintained within the counter 112 during the transmitter off-time, and the counter 112 thus serves as a memory device that retains the transmitter power control state for initial use during a next burst.

Figure 8:
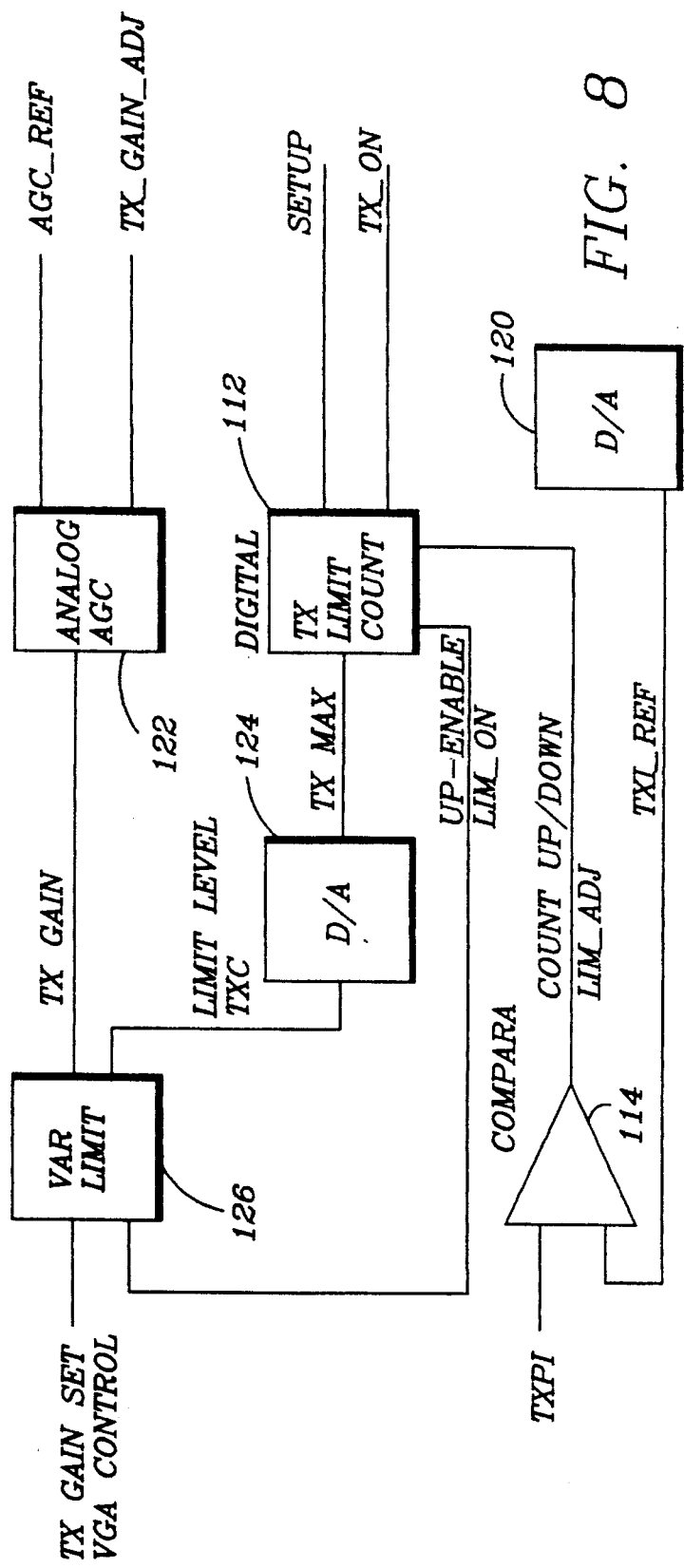
FIG. 8 is a block diagram of an analog embodiment for the direct AGC control with adaptive feedback.

FIG. 8 depicts an analog embodiment of the circuit shown in FIG. 7. In the analog embodiment the TX Gain and TX max digital signals are converted to corresponding analog voltages with D/As 122 and 124. The analog embodiment also uses a TX max-controlled analog limiter 126 in place of the digital multiplexer 116 and the digital comparator 118.

It can be appreciated that the teaching of this invention provides for the transmitter power feedback signal to be used for controlling a maximum transmitter power setting, and not for achieving a closed loop power control. That is, the TXPI signal, in combination with TXPI-ref, is employed to limit the gain of the transmitter so that it does not exceed a setpoint.

Figure 11:
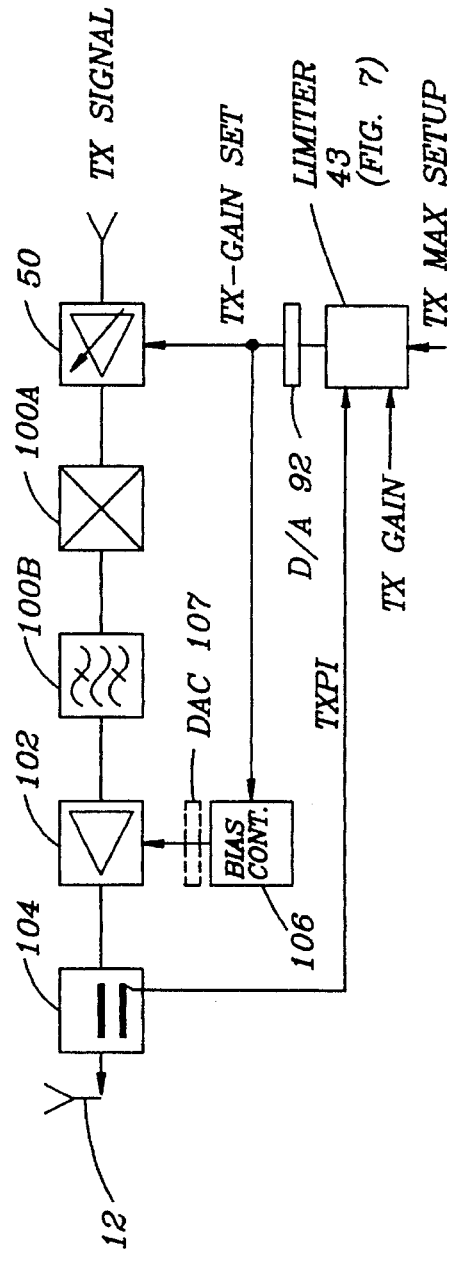
FIG. 11 illustrates a presently preferred technique for controlling the operation of the TX-VGA and the TX power amplifier of FIGS. 9 and 10.

Reference is now made to FIG. 11 which illustrates a presently preferred technique for controlling the operation of the TX-VGA 50 and the TX power amplifier 102.

A fixed input power (TX signal) is fed to the input of the TX-VGA 50. The TX-GAIN SET signal from D/A 92 (FIG. 7) is employed to set the gain of the TX-VGA 50 and, through the bias control block 106, to control the linearity of the transmitter power amplifier 102.

The bias control signal (BCS) is employed to control the DC bias point of the transmitter power amplifier 102 to keep the amplifier operating in a linear mode (class A or class AB). The linearity of the transmitter power amplifier is maintained by controlling the consumption of DC power (volts and/or current) from the DC power supply (not shown).

When the TX-GAIN SET signal increases the output power of the TX-VGA 50 the DC power requirement of the transmitter power amplifier 102 increases accordingly. As such, the bias control 106 generates the bias signal so as to accommodate the increased DC power requirement of the transmitter power amplifier 102, thereby maintaining the desired linearity of the transmitter power amplifier. This serves to optimize the current consumption and linearity of the transmitter power amplifier 102 over the required range of output power.

The bias control block 106 may be implemented with an operational amplifier having suitable scaling resistors for generating the DC bias signal in an analog form. The bias control block 106 may also generate the bias signal in a digital form. For this latter case a digital to analog converter (DAC) 107 can be employed to convert the digital bias signal to an analog form if such is required by the transmitter power amplifier 102.

In either case, the bias point of the transmitter power amplifier 102 is established in accordance with the TX-GAIN SET signal that is applied to the TX-VGA 50. As will be recalled, the level of the TX-GAIN SET signal is determined partly in accordance with the TXPI signal which reflects the actual transmitted power.

While the invention has been particularly shown and described with respect to preferred embodiments thereof, it will be understood by those skilled in the art that changes in form and details may be made therein without departing from the scope and spirit of the invention.

What is claimed is:

1. A method for adaptively controlling the transmitted power of a transmitter, comprising the steps of:

setting a register means for storing a digital representation of an estimate of a value of a maximum transmitter gain signal, the register means having an output that is a representation of a maximum transmitter gain signal TX max;

deriving a transmitter gain signal TX gain from a received signal;

comparing TX max to TX gain and, if TX gain is greater than TX max, applying a first transmitter gain control signal to the transmitter that is derived from TX max, and enabling said register means to increase the stored digital representation of the estimate of the value of the maximum transmitter gain signal;

else, if TX gain is less than TX max, applying a second transmitter gain control signal to the transmitter that is derived from TX gain, and disabling said register means from increasing the stored digital representation of the estimate of the value of the maximum transmitter gain signal.

2. A method as set forth in claim 1 and further including the steps of:

generating a reference transmitted power signal indicator TXPI ref;

generating, as a function of an actual transmitted power, a transmitted power signal indicator TXPI;

comparing TXPI to TXPI ref and, if TXPI is greater than TXPI ref, causing said register means to decrease the stored digital representation of the estimate of the value of the maximum transmitter gain signal without regard for whether TX max is greater than or less than TX gain;

else, causing said register means to increase the stored digital representation of the estimate of the value of the maximum transmitter gain signal, so long as TX gain is greater than TX max.

3. A method as set forth in claim 2 wherein said register means is comprised of an up/down counter means that stores the digital representation of the estimate of the value of the maximum transmitter gain signal, and further comprising a step of selectively applying a control signal TX ON to said counter means to enable said counter means to count up or to count down only when the transmitter is transmitting.

4. A method as set forth in claim 3 wherein the TX ON signal is applied only during a transmission of a burst of information from the transmitter.

5. A method as set forth in claim 1 wherein the transmitter operates in one of at least two modes, and further comprising a step of selectively applying a control signal Mode Control to cause only the first transmitter gain control signal that is derived from TX max to be applied to the transmitter.

6. A method as set forth in claim 5 wherein the Mode Control control signal is applied for indicating that the transmitter is operating in a frequency modulated (FM) mode.

7. A method as set forth in claim 1 wherein the steps of applying the first and second transmitter gain control signal each include a step of converting the TX max or the TX gain signal from a digital format to an analog representation of the digital format.

8. A method as set forth in claim 1 wherein the steps of applying the first and second transmitter gain control signals each include a step of applying a transmitter amplifier slope correction to the first and second transmitter gain control signals.

9. A method as set forth in claim 1 and further comprising the steps of:

applying one of the first and second transmitter gain control signals to a variable gain transmitter amplifier;

modifying the applied one of the transmitter gain control signals to form a bias signal; and applying the bias signal to a transmitter power amplifier to control the linearity of the transmitter power amplifier.

10. A method for adaptively limiting the transmitted power of a transmitter, comprising the steps of:

setting a register means for storing a digital representation of an estimate of a value of a maximum transmitter gain signal, the register means having an output that is a representation of a maximum transmitter gain signal TX max;

deriving a transmitter gain signal TX gain from a received signal;

comparing TX max to TX gain and, if TX gain is greater than TX max, applying a first transmitter gain control signal to the transmitter that is derived from TX max;

else, if TX gain is less than TX max, applying a second transmitter gain control signal to the transmitter that is derived from TX gain;

generating a reference transmitted power signal indicator TXPI ref;

generating, as a function of an actual transmitted power, a transmitted power signal indicator TXPI;

comparing TXPI to TXPI ref and, if TXPI is greater than TXPI ref, and if the transmitter is transmitting a burst of information, decreasing the digital representation of the value of the stored estimate Of the maximum transmitter gain signal;

else, and if the transmitter is transmitting a burst of information, increasing the digital representation of the value of the stored estimate of the maximum transmitter gain signal, so long as TX gain is greater than TX max.

11. Apparatus for adaptively controlling the transmitted power of a transmitter, comprising:

register means having an input for being set with a digital representation of an estimate of a value of a maximum transmitter gain signal, the register means having an output that is a representation of a maximum transmitter gain signal TX max;

means for deriving a transmitter gain signal TX gain from a received signal; and first comparing means for comparing TX max to TX gain, said first comparing means being responsive to a condition wherein TX gain is greater than TX max for applying a first transmitter gain control signal to the transmitter that is derived from TX max and also for enabling said register means to increase the digital representation of the stored value, said first comparing means further being responsive to a condition wherein TX gain is less than TX max for applying a second transmitter gain control signal to the transmitter that is derived from TX gain and also for disabling said register means from increasing the digital representation of the stored value.

12. Apparatus as set forth in claim 11 and further comprising:

means for generating a reference transmitted power signal indicator TXPI ref;

means for generating, as a function of an actual transmitted power, a transmitted power signal indicator TXPI; and second comparing means for comparing TXPI to TXPI ref, said second comparing means being responsive to TXPI being greater than TXPI ref for causing said register means to decrease the digital representation of the stored value without regard for whether TX max is greater than or less than TX gain, said second comparing means further being responsive to TXPI being less than TXPI ref for causing said register means to increase the digital representation of the stored value, so long as TX gain is greater than TX max.

13. Apparatus as set forth in claim 12 wherein said register means is responsive to a control signal TX ON for increasing or decreasing the digital representation of the stored value only when the control signal TX ON is asserted.

14. Apparatus as set forth in claim 13 wherein the TX ON signal is asserted only during a transmission of a burst of information from said transmitter.

15. Apparatus as set forth in claim 11 wherein said transmitter operates in one of at least two modes, and further comprising means for selectively asserting a control signal Mode Control to cause only the first transmitter gain control signal that is derived from TX max to be applied to the transmitter.

16. Apparatus as set forth in claim 15 wherein the Mode Control control signal is asserted for indicating that said transmitter is operating in a frequency modulated (FM) mode.

17. Apparatus as set forth in claim 11 and further including means for converting at least one of said TX max and said TX gain signal from a digital format to an analog representation of the digital format.

18. A method for adaptively controlling the transmitted power of a transmitter, comprising the steps of:

storing in a register means a digital representation of an estimate of a value of a maximum transmitter gain signal, the register means having an output TX max that is a representation of the stored digital representation;

applying a gain control signal to the transmitter that is derived from TX max;

generating a reference transmitted power signal indicator TXPI ref;

generating, as a function of an actual transmitted power, a transmitted power signal indicator TXPI;

comparing TXPI to TXPI ref; and only during a time that TXPI is indicated to be valid, selectively one of incrementing and decrementing the stored digital representation within the register means in accordance with the comparison so as to minimize a difference between TXPI and TXPI ref.

19. A method as set forth in claim 18 wherein said transmitter operates in one of at least two modes, and further comprising an initial step of generating a control signal Mode Control to cause only a gain control signal that is derived from TX max to be applied to the transmitter, wherein the Mode Control signal is generated only when operating in a frequency modulated (FM) mode of operation.

20. A method for adaptively controlling the transmitted power of a transmitter that forms a portion of a radiotelephone that is operable in one of at least two modes of operation including a code division, multiple access (CDMA) first mode of operation and a frequency modulated (FM) second mode of operation, comprising the steps of:

measuring an actual power that is being transmitted by the transmitter to generate a transmitted power indication signal;

comparing the transmitted power indication signal to a reference signal to generate a control signal;

when the radiotelephone is operating in the first mode of operation, adaptively controlling the transmitter power with a transmitter gain control signal that is formed in accordance with one of a generated power control signal, that is a combination of an open loop transmitter power control signal and a closed loop transmitter power control signal, and an adjustable power control signal that is controllably increased and decreased in accordance with the control signal and in accordance with a difference between a value of the generated power control signal and a value of the adjustable power control signal; and when the radiotelephone is operating in the second mode of operation, adaptively controlling the transmitter power with the transmitter gain control signal that is formed in accordance with only the adjustable power control signal that is controllably increased and decreased in accordance with the control signal.

21. A method as set forth in claim 20, wherein the steps of adaptively controlling each include the steps of:

applying the transmitter gain control signal to a variable gain transmitter amplifier;

modifying the transmitter gain control signal to form a bias signal; and applying the bias signal to a transmitter power amplifier to control the linearity of the transmitter power amplifier.

22. A method as set forth in claim 20 and further including the steps of:

receiving a signal Vin with a receiver amplifier;

detecting the received signal with a logarithmic absolute value detector where:

$$Vout=\log(AVG|Vin|),$$

where AVG|Vin| is the average of the absolute value of Vin;

integrating Vout;

applying a receiver slope correction to the integrated Vout to generate a receiver gain setting signal; and controlling the gain of the receiver amplifier with the receiver gain setting signal.

23. A method as set forth in claim 22 and further including the step of:

filtering the integrated Vout to form the open loop transmitter power control signal.

24. A method as set forth in claim 22 wherein the step of detecting includes an initial step of converting the received signal to base band.

* * * * *